US011892473B2

(12) United States Patent
Goossens et al.

(10) Patent No.: US 11,892,473 B2
(45) Date of Patent: Feb. 6, 2024

(54) CHARGE SENSING DEVICE WITH GATE VOLTAGE SELECTED TO OPERATE AROUND THE CHARGE NEUTRALITY POINT AND TUNE THE QUANTUM CAPACITANCE

(71) Applicants: FUNDACIÓ INSTITUT DE CIÈNCIES FOTÒNIQUES, Castelldefels (ES); INSTITUCIÓ CATALANA DE RECERCA I ESTUDIS AVANÇATS, Barcelona (ES)

(72) Inventors: Stijn Goossens, Castelldefels (ES); Frank Koppens, Castelldefels (ES); Gerasimos Konstantatos, Castelldefels (ES)

(73) Assignees: FUNDACIÓ INSTITUT DE CIÈNCIES FOTÒNIQUES, Castelldefels (ES); INSTITUCIÓ CATALANA DE RECERCA I ESTUDIS AVANÇATS, Barcelona (ES)

(*) Notice: Subject to any disclaimer, the term of this patent is extended or adjusted under 35 U.S.C. 154(b) by 4 days.

(21) Appl. No.: 17/427,505

(22) PCT Filed: Jan. 31, 2020

(86) PCT No.: PCT/EP2020/052468
§ 371 (c)(1),
(2) Date: Jul. 30, 2021

(87) PCT Pub. No.: WO2020/157299
PCT Pub. Date: Aug. 6, 2020

(65) Prior Publication Data
US 2022/0137098 A1 May 5, 2022

(30) Foreign Application Priority Data
Jan. 31, 2019 (EP) .................... 19382066

(51) Int. Cl.
*G01R 15/16* (2006.01)
*G01R 29/24* (2006.01)

(52) U.S. Cl.
CPC ............. *G01R 15/16* (2013.01); *G01R 29/24* (2013.01)

(58) Field of Classification Search
CPC ........ G01R 15/16; G01R 29/24; H04N 25/76; H04N 25/57; H01L 27/13; H01L 27/14603
See application file for complete search history.

(56) References Cited

U.S. PATENT DOCUMENTS 8,223,177 B2 * 7/2012 Nathan ................ G09G 3/3291
345/82
10,191,005 B2 1/2019 Koester
(Continued)

FOREIGN PATENT DOCUMENTS

| EP | 3 073 728 A1 | 9/2016 |
| EP | 3 429 190 A1 | 1/2019 |
| JP | H06177417 | * 6/1994 |

OTHER PUBLICATIONS

Koester, "Using the quantum capacitance in graphene to enable varactors for passive wireless sensing applications". (Year: 2011).*
(Continued)

*Primary Examiner* — Feba Pothen
(74) *Attorney, Agent, or Firm* — Jenkins, Taylor & Hunt P.A.

(57) ABSTRACT

The present invention relates to a system comprising an electronic apparatus which comprises: —an electronic device comprising: —a gate electrode (G, BE); —a dielectric (D) arranged over the gate electrode (G, BE); and —a charge sensing structure (CE) with a 2-dimensional charge sensing layer to provide a gate capacitance ($C_g$) between the charge sensing structure (CE) and the gate electrode struc-
(Continued)

ture (G, BE) and a quantum capacitance ($C_q$) resulting in a total capacitance ($C_{tot}$); —a voltage detector to detect an output voltage ($V_o$) stored in the total capacitance ($C_{tot}$). The system further comprises means to apply a gate voltage ($V_g$) to the gate electrode structure (G, BE) selected to: —make the device operate around most sensitive point of fermi level of the charge sensing structure (CE); and —tune the quantum capacitance ($C_q$). The present invention also relates to an electronic apparatus adapted to allow the tuning of its quantum capacitance.

15 Claims, 3 Drawing Sheets

(56) References Cited

U.S. PATENT DOCUMENTS

| | | |
|---|---|---|
| 2013/0069714 A1 | 3/2013 | Kim |
| 2014/0111652 A1 | 4/2014 | So et al. |
| 2018/0197956 A1 | 7/2018 | Lee et al. |

OTHER PUBLICATIONS

Foxe et al. Detection of ionizing radiation using graphene field effect transistors. 2009 IEEE Nuclear Science Symposium and Medical Imaging Conference (NSS/MIC 2009), Orlando, FL, USA, IEEE, Piscataway, New Jersey, USA, Oct. 24, 2009, pp. 90-95.

International Search Report for PCT International Patent Application Serial No. PCT/EP2020/052468 dated Aug. 6, 2020.

Written Opinion of the International Searching Authority for PCT International Patent Application Serial No. PCT/EP2020/052468 dated Aug. 6, 2020.

Konstantatos et al (2012) Hybrid graphenequantum dot phototransistors with ultrahigh gain. Nature Nanotech 7, 363-368.

Moldovan et al. Graphene quantum capacitators for high-Q tunable LC-tanks for RF ICs. 2016 46th European Solid-State Device.

Reddy et al. Topical Review; Graphene field-effect transistors; Topical Review. Journal of Physics D: Applied Physics, Institute of Physics Publishing LTD, GB, vol. 44, No. 31, Jul. 14, 2011, p. 313001.

Schedin, F.et al (2007) "Detection of individual gas molecules adsorbed on graphene," Nature Mater 6, 652-655.

Fu et al (2017), "Biosensing near the neutrality point of graphene," Science Advances 3, e1701247.

\* cited by examiner

CHARGE SENSING DEVICE WITH GATE VOLTAGE SELECTED TO OPERATE AROUND THE CHARGE NEUTRALITY POINT AND TUNE THE QUANTUM CAPACITANCE

CROSS REFERENCE TO RELATED APPLICATIONS

This application is a United States National Stage entry of PCT International Patent Application Publication No. PCT/EP2020/052468, filed Jan. 31, 2020, which itself claims benefit of European Application Serial No. EP 19382066.9, filed on Jan. 31, 2019, the disclosure of each of which is incorporated herein by reference in its entirety.

FIELD OF THE INVENTION

The present invention relates, in a first aspect, to a system comprising an electronic apparatus, comprising an electronic device constituting a capacitor that is used for charge sensing purposes and shows quantum capacitance tunable by the system while operating the device around the most sensitive point of fermi level.

A second aspect of the present invention relates to an electronic apparatus like the one of the system of the first aspect of the invention, and adapted to allow the tuning of the quantum capacitance.

BACKGROUND OF THE INVENTION

Systems which comprise the features of the preamble clause of claim 1 of the present invention are known in the art, i.e. those which comprise an electronic apparatus comprising:
an electronic device comprising:
  a gate electrode structure;
  a dielectric structure arranged over said gate electrode structure; and
  a charge sensing structure comprising at least one 2-dimensional charge sensing layer configured to sense electrical charges and/or electrical charge density changes induced by an external physical quantity, and that is configured and arranged over said dielectric structure to provide a gate capacitance between the charge sensing structure and the gate electrode structure, wherein said charge sensing structure shows a quantum capacitance in series with said gate capacitance resulting in a total capacitance between the charge sensing structure and the gate electrode structure;
a voltage detector electrically connected to the charge sensing structure or to the gate electrode structure, to detect an output voltage $V_{out}$ that is representative of said sensed electrical charges $Q_s$ stored on the capacitor C.

The output voltage is $V_{out}=Q_s/C$. To optimize the output voltage the capacitance needs to be minimized.

The classical capacitance of the gate capacitor $C_g$ formed by the charge sensing structure and the gate electrode structure is given by the following formula:

$$C_g = \varepsilon_r \varepsilon_0 A/d$$

Where $\varepsilon_r$ is the relative permittivity of the dielectric material, $\varepsilon_0$ is the vacuum permittivity, A the area of the capacitor and d the thickness of the dielectric material.

When a large sensitivity of the device is required the capacitance needs to be as small as possible and hence the thickness of the dielectric d needs to be as large as possible to maximize the output voltage for a given amount of charges $Q_s$. For those high sensitivity applications, the capacitances to the gate electrode structure and contacts and the parasitic capacitances of the voltage detector, and possible read-out circuitry, need to be minimized to be able to detect the output voltage or read an output signal associated thereto. One way to minimize parasitic capacitances to the read-out circuitry is to integrate the detectors in a silicon complementary metal oxide semiconductor (CMOS) circuit.

For 2-dimensional materials there is another capacitance that needs to be taken into account due to their finite density of states. This is the above mentioned quantum capacitance $C_q$. $C_q$ is in series with the classical capacitance and thus reduces the total capacitance $C_{tot}$ of the system ($1/C_{tot}=1/C_g+1/C_q$). Due to the quantum capacitance effect, the output voltage $V_o$ can be enhanced for a certain charge $Q_s$ that needs to be sensed.

For example, when the 2-dimensional material is graphene, the quantum capacitance per unit area $C_q/A$ is described as follows:

$$C_Q = \frac{2e^2}{\hbar \, v_F \sqrt{\pi}} (|n_G| + |n^*|)^{1/2}$$

Where e is the electron charge, $\hbar$ the planck constant, $v_F$ the Fermi velocity of graphene, $n_G$ the induced carrier density in the graphene and n* the residual impurity density.

$C_g$ for a typical gate dielectric thickness of 10 nm made of $Al_2O_3$ is 0.0053 $F/m^2$. The minimum quantum capacitance of a capacitor with the same dielectric thickness for a high electronic quality graphene layer at room temperature ($n^*=7\cdot10^{10}$ $cm^{-2}$) will be 0.0012 $F/m^2$. In this case the quantum capacitance will enhance the output voltage by a factor 5.

However, although those known apparatuses provide a high sensitivity, for many applications that sensitivity is not high enough or the dynamic range is not large enough.

Also, for that quantum capacitance have an effect on the total capacitance, the electronic device must operate around most sensitive point of fermi level of the charge sensing structure, i.e. around the charge neutrality point (cnp) when the 2-dimensional material is graphene, which does not occur by nature.

The following documents disclose different prior art electronic devices including a 2-dimensional charge sensing layer configured to sense electrical charges and/or electrical charge density changes induced by an external physical quantity:

Konstantatos, G., Badioli, M., Gaudreau, L. et al. Hybrid graphenequantum dot phototransistors with ultrahigh gain. Nature Nanotech 7, 363-368 (2012).

Schedin, F., Geim, A., Morozov, S. et al. Detection of individual gas molecules adsorbed on graphene. Nature Mater 6, 652-655 (2007).

Wangyang Fu, Lingyan Feng, Gregory Panaitov, et al., Biosensing near the neutrality point of graphene, Science Advances 3, e1701247, (2017).

It is, therefore, necessary to provide an alternative to the state of the art which covers the gaps found therein, by providing a system including the features described above, but which does not possess the above mentioned drawbacks, and is thus able mainly to provide an active control between sensitivity level and dynamic range, so as to achieve the sensitivity level and dynamic range required, with the same system.

SUMMARY OF THE INVENTION

To that end, the present invention relates, in a first aspect, to a system comprising an electronic apparatus, wherein the electronic apparatus comprises:
an electronic device comprising:
  a gate electrode structure;
  a dielectric structure arranged over said gate electrode structure; and
  a charge sensing structure comprising at least one 2-dimensional charge sensing layer configured to sense electrical charges and/or electrical charge density changes induced by an external physical quantity (for example, as described in the above cited prior art references), and that is configured and arranged over said dielectric structure to provide a gate capacitance $C_g$ between the charge sensing structure and the gate electrode structure; wherein said charge sensing structure (by having a density of states low enough) shows a quantum capacitance $C_q$ in series with the gate capacitance $C_g$ resulting in a total capacitance $C_{tot}$ between the charge sensing structure and the gate electrode structure;
a voltage detector electrically connected to the charge sensing structure or the gate electrode structure, to detect an output voltage that is representative of the sensed electrical charges stored in the total capacitance $C_{tot}$.

In contrast to the systems of the state of the art, the one provided by the present invention further comprises means configured and arranged to apply a gate voltage to the gate electrode structure, wherein said gate voltage is selected to, both:
  make the electronic device operate around the most sensitive point of fermi level of the charge sensing structure, i.e. around the charge neutrality point (cnp) when the 2-dimensional material is graphene; and
  tune the quantum capacitance $C_q$ to modify the sensitivity and dynamic range of the electronic device.

Therefore, the system of the first aspect of the present invention constitutes a hybrid system which can be actively controlled to operate as desired, for high sensitivity applications, and also for high dynamic range applications, depending on the gate voltage applied.

For an embodiment, said means comprise a voltage source that generates said gate voltage.

The terms "voltage source" must be interpreted in the present invention as any kind of real-world voltage source (i.e. with non-zero internal resistance and output impedance) known in the prior art, such as one comprising or formed by one or more battery cells, by one or more voltage generators, etc., for providing one or any number of voltages.

For an implementation of said embodiment, the output of the voltage source is electrically connected to the gate electrode structure, whether directly or through a switch, to apply the gate voltage thereto.

For a preferred embodiment, the above mentioned means comprise a control unit configured and arranged to apply the gate voltage to the gate electrode structure, and to perform the above mentioned selection of the gate voltage.

The terms "select" and "selection", with respect to the gate voltage, means the action of carefully choosing the best or most suitable gate voltage value for achieving the above stated goals, i.e.:
  make the electronic device operate around the most sensitive point of fermi level of the charge sensing structure, i.e. around the charge neutrality point (cnp) when the 2-dimensional material is graphene; and
  tune the quantum capacitance $C_q$ to modify the sensitivity and dynamic range of the electronic device.

Any known selection process which the skilled person would consider as appropriate for the one of the present invention is embraced by the system of the present invention, including the selection of the gate voltage value directly from an available pool of gate voltage values, or indirectly by calculating the same from selected values of other kind of electrical parameters (such as electric current values and/or electrical resistance values) out of a pool of available values for said other kind of electrical parameters.

Depending on the implementation of said embodiment, the control unit includes or has access to a voltage source configured to generate the gate voltage.

According to different embodiments, the gate voltage is a DC voltage, an AC voltage, or a combination of DC and AC voltages (such as an AC voltage superimposed on a DC offset, or any kind of frequency and/or temporal combination).

For an embodiment, the control unit is configured to select the properties of the gate voltage, at least regarding its magnitude, while for another embodiment for which the gate voltage includes an AC voltage, the control unit is configured to select the properties of the gate voltage also regarding its frequency and/or phase, and while for a further embodiment for which the control voltage includes an DC voltage, the control unit is configured to select the properties of the control voltage also regarding its polarity.

According to an embodiment, the control unit comprises a selection input to receive selection signals regarding operation modes, and the control unit is configured to select and apply the gate voltage to the gate electrode structure in response to a selection signal received through that selection input, to make the apparatus operate according to the selected operating mode.

Advantageously, the control unit is also configured not to apply the gate voltage to the gate electrode structure also in response to a selection signal received through the selection input, so that the control unit is suitable also to make the electronic device operate according to the conventional sensitive mode, for a certain charge that needs to be sensed, intrinsically provided by the electronic device.

For an embodiment, the operation modes include at least the following modes:
  a high sensitivity mode, in which the control unit does not apply said gate voltage to the gate electrode structure or selects and applies a gate voltage with an absolute magnitude below $(0.9*V_t-V_{cnp})$ volts, where $V_t=q_e \cdot n^* \cdot A/C_g$, where $q_e$ is the electron charge, $n^*$ the residual charge carrier density, A the area and $C_g$ the capacitance of the gate and $V_{cnp}$ the voltage at which $C_q$ is lowest, to reduce, not to increase or increase just a percentage below 35% said quantum capacitance;
  a high dynamic range mode, in which the control unit selects and applies to the gate electrode structure a gate voltage with an absolute magnitude above $(1.1*V_t-V_{cnp})$ volts, to increase to a percentage above 45% said quantum capacitance; and a trade-off mode, in which the control unit selects and applies to the gate electrode structure a gate voltage with an absolute magnitude between $(0.9\text{–}1.1*V_t - V_{cnp})$ volts range, to increase said quantum capacitance to a percentage between 35 and 45% range.

For an embodiment, the voltage detector includes a reset circuit to discharge the total capacitance $C_{tot}$ under the control of the control unit, and the apparatus further comprises a read-out circuit operatively connected to the out of the voltage detector to provide a read-out signal based on the detected output voltage.

The gate electrode structure together with the dielectric and charge sensing structures arranged there over, is arranged, for an embodiment, on a substrate.

According to an embodiment of the system of the first aspect of the present invention, the control unit further comprises an adjustment input connected to an output of the voltage detector or of a read-out circuit operatively connected thereto, and is configured to implement a closed-loop adjustment process to adjust the gate voltage based on a detected output voltage or read-out signal received through that adjustment input, and preferably also based on reference or set-point values with which the detected output voltage(s) or read-out signal(s) are compared, so that a desired sensitivity and/or dynamic range is achieved.

In other words, a close-loop arrangement is made, for that embodiment, electrically connecting said adjustment input of the control unit to an output of the voltage detector providing the detected output voltage or an output of a read-out circuit operatively connected to the out of the voltage detector to provide a read-out signal. Therefore, the control unit is configured to adjust the gate voltage as described in the above paragraph, i.e. based at least on the signal received through that adjustment input.

For an implementation of said embodiment, the control unit is configured to implement the closed-loop adjustment process also based on the selected operation mode, so that the desired sensitivity and/or dynamic range to be achieved is established depending on the selected operation mode.

For that implementation, in addition to the signal received through the adjustment input the selected operation mode is taken into account in the selection process implemented by the control unit to select the appropriate gate voltage to make the device operate according to the selected mode, check, by the detected output voltage or read-out signal, that the device is really operating in the selected mode (which occurs when the values of the output voltage or read-out signal are within an appropriate range for the selected operation mode) and adjust the gate voltage to assure that the device is maintained I the selected operation mode (i.e. with the values of the output voltage or read-out signal within the appropriate range for the selected operation mode).

According to some embodiments, the electronic device of the electronic apparatus of the system of the first aspect of the present invention further comprises a sensitizing or functionalizing structure arranged over the charge sensing structure, wherein the sensitizing or functionalizing structure is configured to induce the electrical charge carriers and/or modify the charge carrier density therein induced by said external physical quantity. Generally the sensitizing or functionalizing structure is only sensitive to said external physical quantity.

The term "functionalizing" means for the present invention, to add a species to the charge sensing structure that not only provides a sensitizing function, but also adds another functionality. For example, in the paper by Wangyang Fu (Wangyang Fu, Lingyan Feng, Gregory Panaitov, et al., Biosensing near the neutrality point of graphene, Science Advances 3, e1701247, (2017).) a pPNA linker molecule is added to the surface of the graphene to allow ssDNA to link to the graphene and a Tween 20 molecule was added to the graphene surface to make the sensing of the ssDNA more specific by inhibiting attachment of other species to the surface to the graphene. Hence in this case the pPNA linker molecule functionalizes AND sensitizes the graphene.

While the term "sensitizing" refers to any species that is added on top of the charge sensing structure that sensitizes it to an external physical quantity or analyte.

For an embodiment, said sensitizing or functionalizing structure is a photoactive structure configured and arranged to, upon illumination, generate electron-hole pairs which, due to a field created by either a Schottky junction between the charge sensing structure and the photoactive structure or a topgate electrode on top of the photoactive structure or an interlayer between the charge sensing structure and the photoactive structure, are separated and either the electrons or holes gets transported, as said induced electrical charge carriers, to the charge sensing structure, so that the optoelectronic apparatus constitutes a photodetector or an image sensor.

For an implementation of that embodiment, the system of the first aspect of the present invention implements an image sensor comprising an array of pixels, wherein the electronic apparatus comprises a plurality of the above mentioned electronic devices each constituting one pixel of said array of pixels, implementing different alternative read-out schemes, for addressing and reading the pixels of the rows and columns of the array, including rolling and global shutter, etc. Different variants of that implementation are covered by the present invention, for some of which a common gate voltage is applied simultaneously to the gate electrode structures of all or part of the electronic devices, while for other variants different gate voltages are applied individually to the gate electrode structures of all or part of the electronic devices.

According to an alternative embodiment, the electronic device is absent of any sensitizing or functionalizing structure arranged over the charge sensing structure, the charge sensing structure being configured to undergo a change in the electrical charge carriers and/or modify the charge carrier density therein induced by the external physical quantity. Examples of these kind of electronic devices which do not need of the existence of any sensitizing or functionalizing structure are given in Schedin, F., Geim, A., Morozov, S. et al. Detection of individual gas molecules adsorbed on graphene. Nature Mater 6, 652-655 (2007).

Therefore, the present invention is generally applied to sensing devices that rely sensing a change in the electrical charge carriers and/or in the charge carrier density in the charge sensing structure induced by said external physical quantity, whether directly on an exposed charge sensing structure, through the intermediation of a sensitizing layer (such as a photo-sensitizing layer, for example made up of PbS colloidal quantum dots, where light can induce the charge carriers in the charge sensing structure, or a linker biomolecule grafted on the charge sensing structure) or through the functionalization of the charge sensing structure (e.g. for biosensing).

The charge sensing structure of the electronic device of the electronic apparatus of the system of the first aspect of present invention comprises one or more 2-dimensional charge sensing layers made of, for example, one or more of the following materials: graphene (pure graphene, modified graphene, or functionalized graphene), black phosphorus, $MoS_2$, $WS_2$, $WSe_2$, etc.

Different physical quantities or analytes can be sensed by the electronic apparatus of the system of the first aspect of the invention, as long as they induce electrical charge carriers in the charge sensing structure and/or a change in the charge carrier density therein, such as light, gas molecules or sensing neuronal signals. The analyte of interest transfers charge to the charge sensing structure or induces an electric field that modifies the charge carrier density thereof.

Another application is for direct sensing of in vivo electrical signals, or for implementing biosensors using chemically bonded linker molecules that enhance the selectivity for specific bio-molecules. When the molecule of interest binds to the linker, it transfer charge to the charge sensing structure or induces an electric field therein that modifies its charge carrier density.

A second aspect of the present invention relates to an electronic apparatus, comprising:
  an electronic device comprising:
    a gate electrode structure;
    a dielectric structure arranged over said gate electrode structure; and
    a charge sensing structure comprising at least one 2-dimensional charge sensing layer configured to sense electrical charges and/or electrical charge density changes induced by an external physical quantity, and that is configured and arranged over said dielectric structure to provide a gate capacitance between the charge sensing structure and the gate electrode structure, wherein the charge sensing structure shows a quantum capacitance in series with said gate capacitance resulting in a total capacitance between the charge sensing structure and the gate electrode structure;
  a voltage detector electrically connected to the charge sensing structure or the gate electrode structure, to detect an output voltage that is representative of said sensed electrical charges stored in said total capacitance.

In contrast to the electronic apparatuses known in the state of the art, the one of the second aspect of the present invention comprises at least an input terminal electrically connected to the gate electrode structure and that is accessible to apply thereto a gate voltage selected to, both:
  make the electronic device operate around most sensitive point of fermi level of the charge sensing structure, i.e. the charge neutrality point when the 2-dimensional material is graphene; and
  tune the quantum capacitance to modify the sensitivity and dynamic range of the electronic device.

The embodiments described in the present document regarding the electronic apparatus of the system of the first aspect of the present invention are valid for describing corresponding embodiments of the electronic apparatus of the second aspect of the present invention.

BRIEF DESCRIPTION OF THE FIGURES

In the following some preferred embodiments of the invention will be described with reference to the enclosed figures. They are provided only for illustration purposes without however limiting the scope of the invention.

DESCRIPTION OF THE PREFERRED EMBODIMENTS

Figure 1:
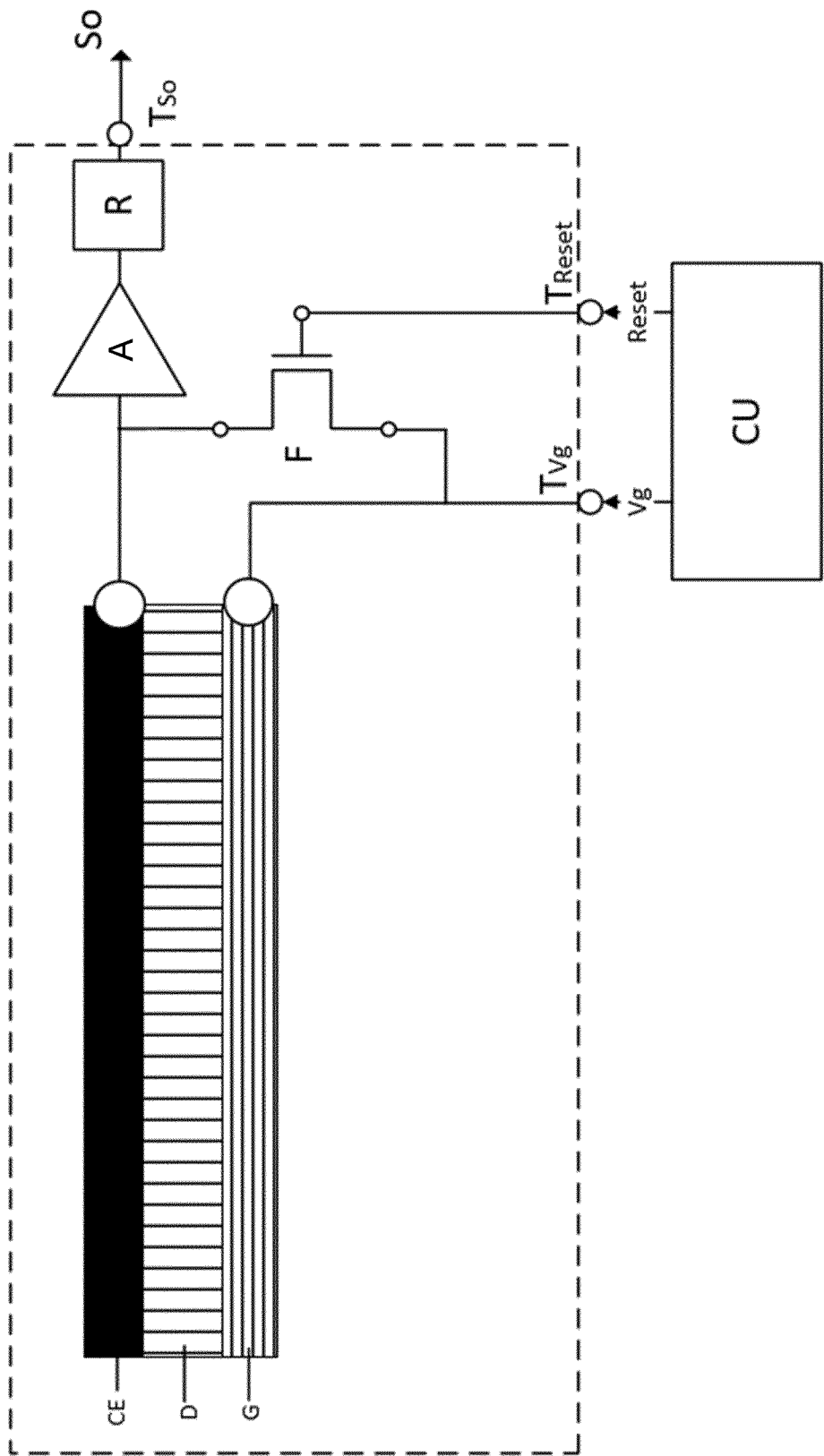
FIG. 1 schematically shows the system of the first aspect of the present invention, for an embodiment.

FIG. 1 shows an embodiment of the system of the first aspect of the present invention, for which the system comprises an electronic apparatus which comprises the components depicted within a dotted-line square, i.e. an electronic device comprising:
  a gate electrode structure G;
  a dielectric structure D arranged over the gate electrode structure G; and
  a charge sensing structure CE comprising a 2-dimensional charge sensing layer configured to sense electrical charges and/or electrical charge density changes induced by an external physical quantity, and that is configured and arranged over the dielectric structure D to provide a gate capacitance $C_g$ between the charge sensing structure CE and the gate electrode structure G.

The charge sensing structure CE has a density of states low enough to provide a quantum capacitance $C_q$ in series with the gate capacitance $C_g$ resulting in a total capacitance $C_{tot}$ in value between $C_q$ and $C_g$ ($C_{tot}$=1/(1/$C_q$+1/$C_g$)) when measured between the charge sensing structure CE and the gate electrode structure G.

As shown in FIG. 1, also within the dotted-line square, the electronic apparatus further comprises a voltage detector, formed by an amplifier A which input is electrically connected to the charge sensing structure CE, to detect an output voltage $V_o$ that is representative of the sensed electrical charges stored in the total capacitance $C_{tot}$.

The system of the first aspect of the present invention further comprises means which for the illustrated embodiment comprise a control unit CU configured and arranged to apply a gate voltage $V_g$ to the gate electrode structure G, wherein the gate voltage $V_g$ is selected by the control unit CU to, both:
  make the electronic device operate around the most sensitive point of fermi level of the charge sensing structure CE, i.e. around the charge neutrality point when the 2-dimensional material is graphene; and tune the quantum capacitance $C_q$ to modify the sensitivity and dynamic range of the electronic device.

As shown in FIG. 1, the voltage detector includes a reset circuit, formed by a transistor F, to discharge the total capacitance $C_{tot}$ under the control of the control unit CU (by closing the transistor F so as to connect $C_{tot}$ to the gate electrode structure G), and the apparatus further comprises a read-out circuit R operatively connected to the out of the voltage detector to provide a read-out signal $S_o$ based on the detected output voltage $V_o$.

For the illustrated embodiment, the voltage detector includes an amplifier A, which needs to have a low input capacitance and thus a very high input impedance, although other kind of known voltage detectors are also covered by the present invention.

The read sequence is as follows:
1. Close Reset transistor F
2. Apply $V_g$
3. Read $S_o$
4. Open reset transistor F to drain charges FIG. 1 also shows an embodiment of the electronic apparatus of the second aspect of the present invention which comprises the components depicted within or in contact with the contour of the dotted-line square, i.e. the components of the electronic apparatus of the system of the first aspect of the present invention and further an input terminal $TV_g$ electrically connected to the gate electrode structure G and that is accessible to apply thereto a gate voltage $V_g$ selected to, both:

make the electronic device operate around the most sensitive point of fermi level of the charge sensing structure CE, i.e. around the charge neutrality point when the 2-dimensional material is graphene; and tune the quantum capacitance to modify the sensitivity and dynamic range of the electronic device.

For an implementation of that embodiment, the components of the electronic apparatus are embedded in an integrated circuit chip, which has an input pin for terminals $TV_g$, a further input pin to connect to the illustrated reset terminal $T_{Reset}$ and also an output pin connected to terminal $TS_o$, so that a control unit CE can be connected to those input pins to provide gate voltage $V_g$ and Reset signal, while $S_o$ goes out through output terminal $TS_o$.

Figure 2:
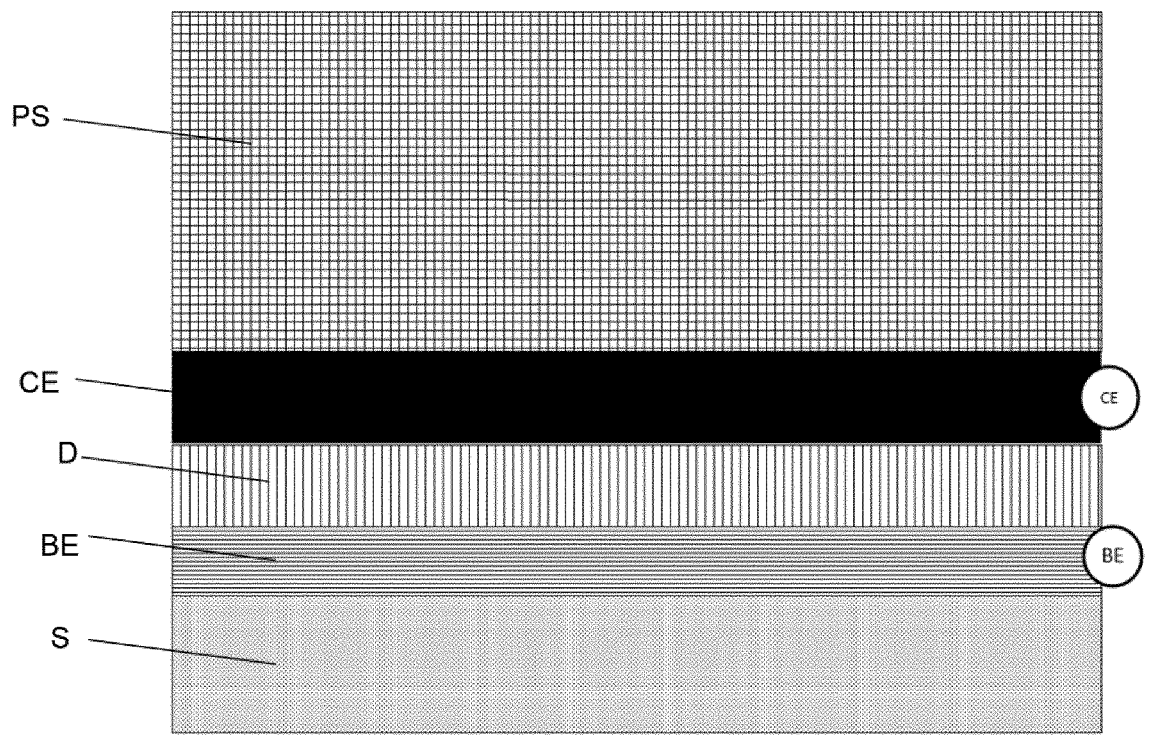
FIG. 2 is a schematic side view of the structure of the electronic device of the electronic apparatus of the second aspect of the invention and of the electronic apparatus of the system of the first aspect, for an embodiment, with electrical connections indicated as round circles: CE=charge sensing layer electrode and BE=bottom electrode.
Figure 3:
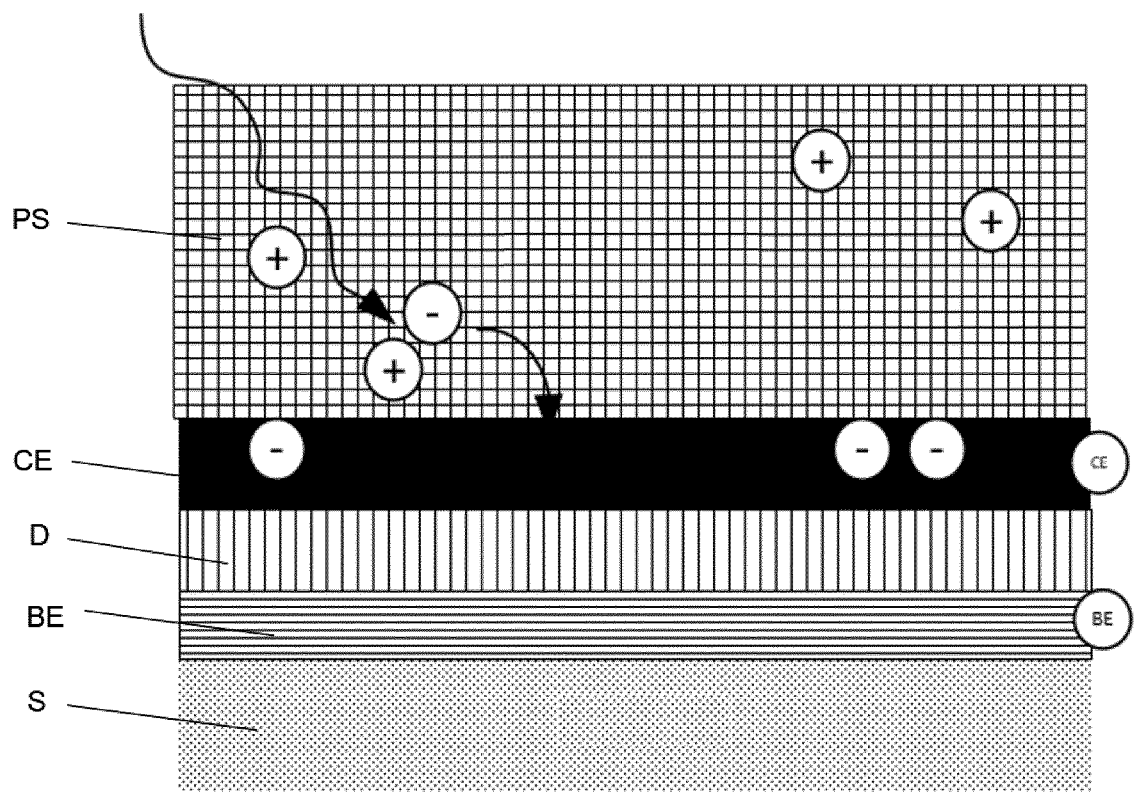
FIG. 3 is a schematic side view of the of the electronic device of the electronic apparatus of the second aspect of the invention and of the electronic apparatus of the system, for an embodiment for which the electronic device comprises a photoactive structure for, upon illumination, generate electron-hole pairs which are separated and one of them gets transported to the charge sensing structure (CE), as indicated by the charge flow illustrated.

In FIG. 2, an embodiment of the system and electronic apparatus of the present invention is shown, for which the electronic device is a photodetector which comprises a substrate S, a bottom electrode structure BE (as the above mentioned gate structure), and a sensitizing or functionalizing structure PS constituted by a photoactive structure PS (formed by colloidal quantum dots, III-V semiconductor, perovskites, 2D material, etc.) arranged over the charge sensing structure CE (for example, formed by a single layer or few layer graphene, black phosphorus, MoS2, WS2, WSe2 etc.) configured and arranged to, upon illumination, generate electron-hole pairs which, due to a built-in field created by a Schottky junction between the charge sensing structure CE and the photoactive structure PS, are separated and either the electrons or holes (depending on the type of Schottky junction) gets transported to the charge sensing structure CE. A voltage now builds up on the gate capacitor $C_g$. In case of a photosensitive layer it is the total photogenerated charge: $Q_{ph}=EQE*q_e*\tau_{tr} A/E_p$ I, (EQE is the external quantum efficiency, $q_e$ the electron charge, $\tau_{tr}$ the trapping time of the photogenerated charges and I the irradiance, A the area of the device and $E_p$ the photon energy). This process is illustrated in FIG. 3.

Figure 4:
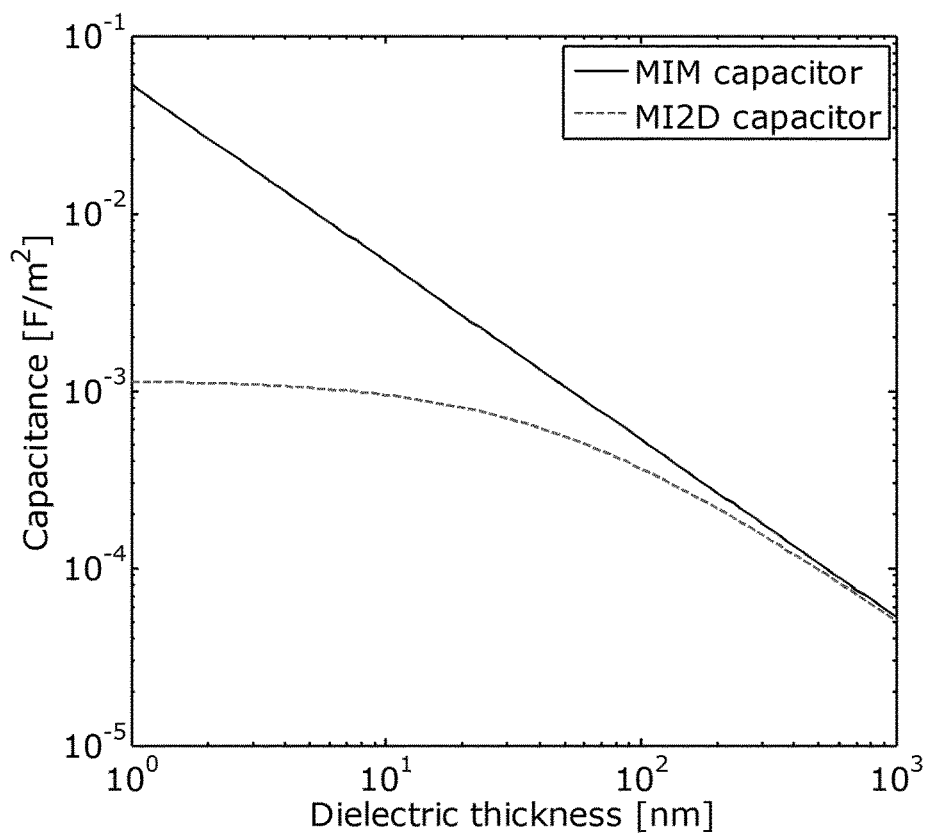
FIG. 4 is a plot of the capacitance for a conventional parallel plate capacitor with two metal plates (MIM: "Metal-Insulator-Metal") and the total capacitance (including quantum capacitance) for a parallel plate capacitor of which one plate is a layer of 2D material (MI2D: "Metal-Insulator-2D material").

FIG. 4 plots the total capacitance of a conventional parallel plate capacitor with two metal plates (MIM) and the total capacitance (including quantum capacitance) for a parallel plate capacitor of which one plate is a layer of 2D material exhibiting quantum capacitance effects (MI2D). A typical gate dielectric thickness of 10 nm made of $Al_2O_3$ ($\varepsilon r=6$) and the minimum quantum capacitance for a high electronic quality graphene layer in a capacitor with the same dielectric at room temperature ($n*=7\cdot 10^{10}$ cm$^{-2}$): 0.0012 F/m$^2$ were taken. For a typical gate dielectric thickness of 10 nm made of $Al_2O_3$ the normal capacitance is 0.0053 F/m2. In this case the signal will be enhanced by a factor 5.

Figure 5:
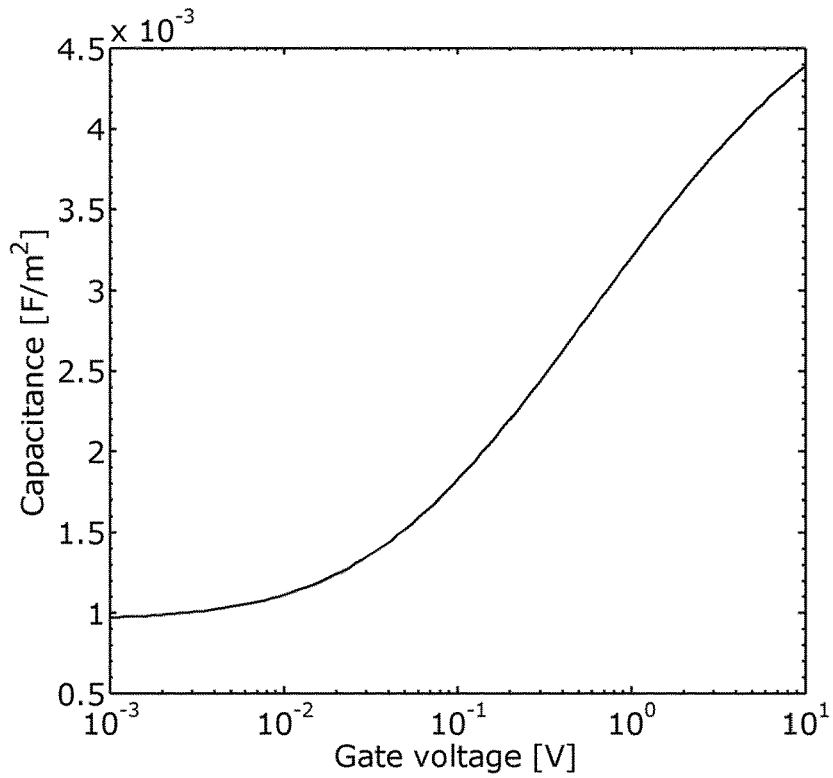
FIG. 5 is a plot of the capacitance of the electronic device of the electronic apparatus of the second aspect of the invention and of the electronic apparatus of the system of the first aspect of the present invention, as a function of the applied gate voltage $V_g$ with respect to the charge neutrality point (d=10 nm, $\varepsilon_r$=6, n*=7·$10^{10}$ cm$^{-2}$).

For the present invention, particularly when a large detector sensitivity is not required, the electronic device can be tuned to the classical regime by applying a different $V_g$ to allow for more photogenerated charges (or charges generated by other means, for those embodiments not including a photosensitizing structure) to be stored and thus enable a larger dynamic range. This effect is illustrated in FIG. 5 with the results obtained from a simulation of the present invention for the arrangement of FIGS. 2 and 3. As shown in that Figure, applying a gate voltage of 3V with respect to the charge neutrality point gives a capacitance that is 3× enhanced.

A person skilled in the art could introduce changes and modifications in the embodiments described without departing from the scope of the invention as it is defined in the attached claims.

The invention claimed is:

1. A system comprising an electronic apparatus, wherein the electronic apparatus comprises:
   an electronic device comprising:
   a gate electrode structure;
   a dielectric structure arranged over said gate electrode structure; and
   a charge sensing structure comprising at least one 2-dimensional charge sensing layer configured to sense at least one of electrical charges and electrical charge density changes induced by an external physical quantity, and that is configured and arranged over said dielectric structure to provide a gate capacitance between the charge sensing structure and the gate electrode structure; wherein said charge sensing structure shows a quantum capacitance in series with said gate capacitance resulting in a total capacitance between the charge sensing structure and the gate electrode structure;
   a voltage detector electrically connected to the charge sensing structure or to the gate electrode structure, to detect an output voltage that is representative of said sensed electrical charges stored in said total capacitance;
   wherein the system further comprises a mechanism configured and arranged to apply a gate voltage to said gate electrode structure, wherein said gate voltage is selected to, both:
   make the electronic device operate around a most sensitive point of fermi level of the charge sensing structure; and
   tune the quantum capacitance to modify a sensitivity and dynamic range of the electronic device.

2. The system according to claim 1, wherein said mechanism comprises a voltage source that generates said gate voltage.

3. The system according to claim 1, wherein said mechanism comprises a control unit configured and arranged to apply said gate voltage to said gate electrode structure, and to perform said selection of the gate voltage.

4. The system according to claim 3, wherein said gate voltage is a DC voltage, an AC voltage, or a combination of DC and AC voltages, and wherein the control unit is configured to select the properties of said gate voltage, at least regarding its magnitude.

5. The system according to claim 3, wherein the control unit comprises a selection input to receive selection signals regarding operation modes, and wherein the control unit is configured to select and apply said gate voltage to said gate electrode structure in response to a selection signal received through said selection input, to make the apparatus operate according to the selected operating mode.

6. The system according to claim 5, wherein the control unit is configured not to apply said gate voltage to said gate electrode structure also in response to a selection signal received through said selection input.

7. The system according to claim 5, wherein said operation modes include at least the following modes:
  a high sensitive mode, in which the control unit does not apply said gate voltage to the gate electrode structure or selects and applies a gate voltage with an absolute magnitude below (0.9*Vt−Vcnp) volts, where $Vt=qe \cdot n^* \cdot A/Cg$, where qe is the electron charge, n* the residual charge carrier density, A the area and Cg the capacitance of the gate and Vcnp the voltage at which the quantum capacitance is lowest, to reduce, not to increase or increase just a percentage below 35% said quantum capacitance;
  a high dynamic range mode, in which the control unit selects and applies to the gate electrode structure a gate voltage with an absolute magnitude above (1.1*Vt−Vcnp) volts, to increase to a percentage above 45% said quantum capacitance; and
  a trade-off mode, in which the control unit selects and applies to the gate electrode structure a gate voltage with an absolute magnitude between 0.9−(1.1*Vt−Vcnp) volts range, to increase said quantum capacitance to a percentage ranging between 35 and 45%.

8. The system according to claim 3, wherein the control unit further comprises an adjustment input connected to an output of said voltage detector or of a read-out circuit operatively connected thereto, and is configured to implement a closed-loop adjustment process to adjust the gate voltage based on a detected output voltage or read-out signal received through said adjustment input.

9. The system according to claim 7, wherein the control unit further comprises an adjustment input connected to an output of said voltage detector or of a read-out circuit operatively connected thereto, and is configured to implement a closed-loop adjustment process to adjust the gate voltage based on a detected output voltage or read-out signal received through said adjustment input, and wherein the control unit is configured to implement said closed-loop adjustment process also based on the selected operation mode.

10. The system according to claim 3, wherein said voltage detector includes a reset circuit to discharge the total capacitance under the control of the control unit, and wherein the apparatus further comprises a read-out circuit operatively connected to the out of the voltage detector to provide a read-out signal based on the detected output voltage.

11. The system according to claim 1, wherein the electronic device further comprises a sensitizing or functionalizing structure arranged over said charge sensing structure, wherein said sensitizing or functionalizing structure is configured to at least one of induce said electrical charge carriers and modify the charge carrier density therein induced by said external physical quantity, wherein the sensitizing or functionalizing structure is only sensitive to said external physical quantity.

12. The system according to claim 11, wherein said sensitizing or functionalizing structure is a photoactive structure configured and arranged to, upon illumination, generate electron-hole pairs which, due to a field created by either a Schottky junction between the charge sensing structure and the photoactive structure or a topgate electrode on top of the photoactive structure or an interlayer between the charge sensing structure and the photoactive structure, are separated and either the electrons or holes gets transported, as said induced electrical charge carriers, to the charge sensing structure.

13. The system according to claim 12, implementing an image sensor comprising an array of pixels, wherein the electronic apparatus comprises a plurality of said electronic devices each constituting one pixel of said array of pixels.

14. The system according to claim 1, wherein the electronic device is absent of any sensitizing or functionalizing structure arranged over said charge sensing structure, the charge sensing structure being configured to at least one of induce itself said electrical charge carriers and modify the charge carrier density therein induced by said external physical quantity.

15. An electronic apparatus, comprising:
  an electronic device comprising:
  a gate electrode structure;
  a dielectric structure arranged over said gate electrode structure; and
  a charge sensing structure comprising at least one 2-dimensional charge sensing layer configured to sense at least one of electrical charges and electrical charge density changes induced by an external physical quantity, and that is configured and arranged over said dielectric structure to provide a gate capacitance between the charge sensing structure and the gate electrode structure, wherein said charge sensing structure shows a quantum capacitance in series with said gate capacitance resulting in a total capacitance between the charge sensing structure and the gate electrode structure;
  a voltage detector electrically connected to the charge sensing structure or the gate electrode structure, to detect an output voltage stored in said total capacitance and that is representative of said sensed electrical charges;
  wherein the electronic apparatus further comprises at least an input terminal electrically connected to said gate electrode structure and that is accessible to apply thereto a gate voltage selected to, both:
    make the electronic device operate around a most sensitive point of fermi level of the charge sensing structure; and
    tune the quantum capacitance to modify a sensitivity and dynamic range of the electronic device.

* * * * *